(12) United States Patent
Brown

(10) Patent No.: US 11,457,551 B2
(45) Date of Patent: Sep. 27, 2022

(54) MOUNTING-RELATED DEVICE AND MOUNTING SYSTEM

(71) Applicant: FUJI CORPORATION, Chiryu (JP)

(72) Inventor: Daniel Brown, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 96 days.

(21) Appl. No.: 16/970,563

(22) PCT Filed: Mar. 15, 2018

(86) PCT No.: PCT/JP2018/010128
§ 371 (c)(1),
(2) Date: Aug. 17, 2020

(87) PCT Pub. No.: WO2019/176038
PCT Pub. Date: Sep. 19, 2019

(65) Prior Publication Data
US 2021/0120714 A1    Apr. 22, 2021

(51) Int. Cl.
*B23P 19/00* (2006.01)
*H05K 13/04* (2006.01)
*H05K 13/08* (2006.01)

(52) U.S. Cl.
CPC ..... *H05K 13/0495* (2013.01); *H05K 13/0882* (2018.08)

(58) Field of Classification Search
CPC ............. H05K 13/021; H05K 13/0495; H05K 13/0882; H05K 13/0888
See application file for complete search history.

(56) References Cited

U.S. PATENT DOCUMENTS

| | | | |
|---|---|---|---|
| 7,501,778 B2* | 3/2009 | Hashimoto | B25J 9/1674 318/568.11 |
| 9,545,045 B2* | 1/2017 | Yamauchi | H05K 13/0061 |
| 2011/0135429 A1 | 6/2011 | Machida et al. | |

(Continued)

FOREIGN PATENT DOCUMENTS

| | | |
|---|---|---|
| EP | 2 874 480 A1 | 5/2015 |
| EP | 2 874 481 A1 | 5/2015 |
| JP | 2010-82799 A | 4/2010 |

(Continued)

OTHER PUBLICATIONS

International Search Report dated May 22, 2018 in PCT/JP2018/010128 filed on Mar. 15, 2018, 2 pages.

*Primary Examiner* — Paul D Kim
(74) *Attorney, Agent, or Firm* — Oblon, McClelland, Maier & Neustadt, L.L.P.

(57) ABSTRACT

A mounting system includes multiple mounting-related devices to execute a mounting-related process for mounting a component on a mounting target that are arranged side by side along the conveyance direction of the mounting target. The mounting-related device used in the mounting system includes an execution unit configured to execute the mounting-related process; a first interface configured to enable a mobile work device to access the execution unit, the mobile work device moving a member related to the mounting-related process; and an operation panel disposed in a second interface, being located on an opposite side of the first interface, to which an operator is allowed to access without access of the mobile work device.

8 Claims, 7 Drawing Sheets

(56) References Cited

U.S. PATENT DOCUMENTS

2015/0066283 A1    3/2015  Wurman et al.

FOREIGN PATENT DOCUMENTS

| JP | 2016-531816 A | 10/2016 |
|----|---------------|---------|
| WO | WO 2014/010083 A1 | 1/2014 |
| WO | WO 2014/010084 A1 | 1/2014 |
| WO | WO 2017/033268 A1 | 3/2017 |

\* cited by examiner

MOUNTING-RELATED DEVICE AND MOUNTING SYSTEM

TECHNICAL FIELD

The present specification discloses a mounting-related device and a mounting system.

BACKGROUND ART

Conventionally, there are production systems that include a fastening device, a conveyance arm robot, and an internal conveyance device and in which a front side human work region and a rear side arm robot operation region are separated from each other by the fastening device and a casing (for example, see Patent Literature 1). In this production system, a human work can be performed without a need for an operator to enter the robot operation region. Further, there is a known component mounting system including a component storage container, multiple mounting modules, and an automated guided vehicle (AGV) that travels between these devices and via which components are automatically supplied (for example, see Patent Literature 2). In this mounting system, multiple mounting devices for mounting components are arranged along a mounting line.

PATENT LITERATURE

Patent Literature 1: JP-A-2010-82799
Patent Literature 2: International Publication No. WO 2014/010084

BRIEF SUMMARY

Technical Problem

In a mounting system of Patent Literature 2, although automation is advanced, operator work (e.g. error recovery) may be still required, and the operator may be present in a moving region of the automated guided vehicle in such a case. In this case, from a safety point of view, the work of the automated guided vehicle should be stopped, which decreases the operation rate of the automated guided vehicle. A production system of Patent Literature 1 does not employ a mobile work device such as an automated guided vehicle.

A main purpose of the present disclosure is to provide a mounting-related device and a mounting system which can suppress a decrease in the operation rate of the mobile work device.

The present disclosure adopts the following means in order to achieve the above-described main purpose.

A mounting-related device of the present disclosure, which is used in a mounting system, in which multiple mounting-related devices, each being configured to execute a mounting-related process related to a process of mounting a component to a mounting target, are arranged side by side along a conveyance direction of the mounting target, the mounting-related device comprising: an execution unit configured to execute the mounting-related process; a first interface configured to enable a mobile work device to access the execution unit, the mobile work device moving a member related to the mounting-related process; and an operation panel disposed in a second interface, the second interface being located on an opposite side of the first interface and configured to allow an operator access to the operation panel without allowing access by the mobile work device.

The mounting-related device includes an execution unit configured to execute the mounting-related process; a first interface configured to enable a mobile work device to access the execution unit, the mobile work device moving a member related to the mounting-related process; and an operation panel disposed in a second interface, the second interface being located on an opposite side of the first interface and configured to allow an operator access to the operation panel without allowing access by the mobile work device. When the multiple mounting-related devices are arranged along the conveyance direction of the mounting target to form a mounting line, an automatic processing area in which the mobile work device moves and works is formed at the first interface, and an operator area in which an operator works is formed at the second interface. That is, in the mounting-related device, the automatic processing area and the operator area separated from each other by the mounting-related device are formed, and a time during which the operator enters the automatic processing area can be greatly shortened. Therefore, in this mounting-related device, it is possible to suppress a decrease in an operation rate of the mobile work device.

DESCRIPTION OF EMBODIMENTS

Figure 1:
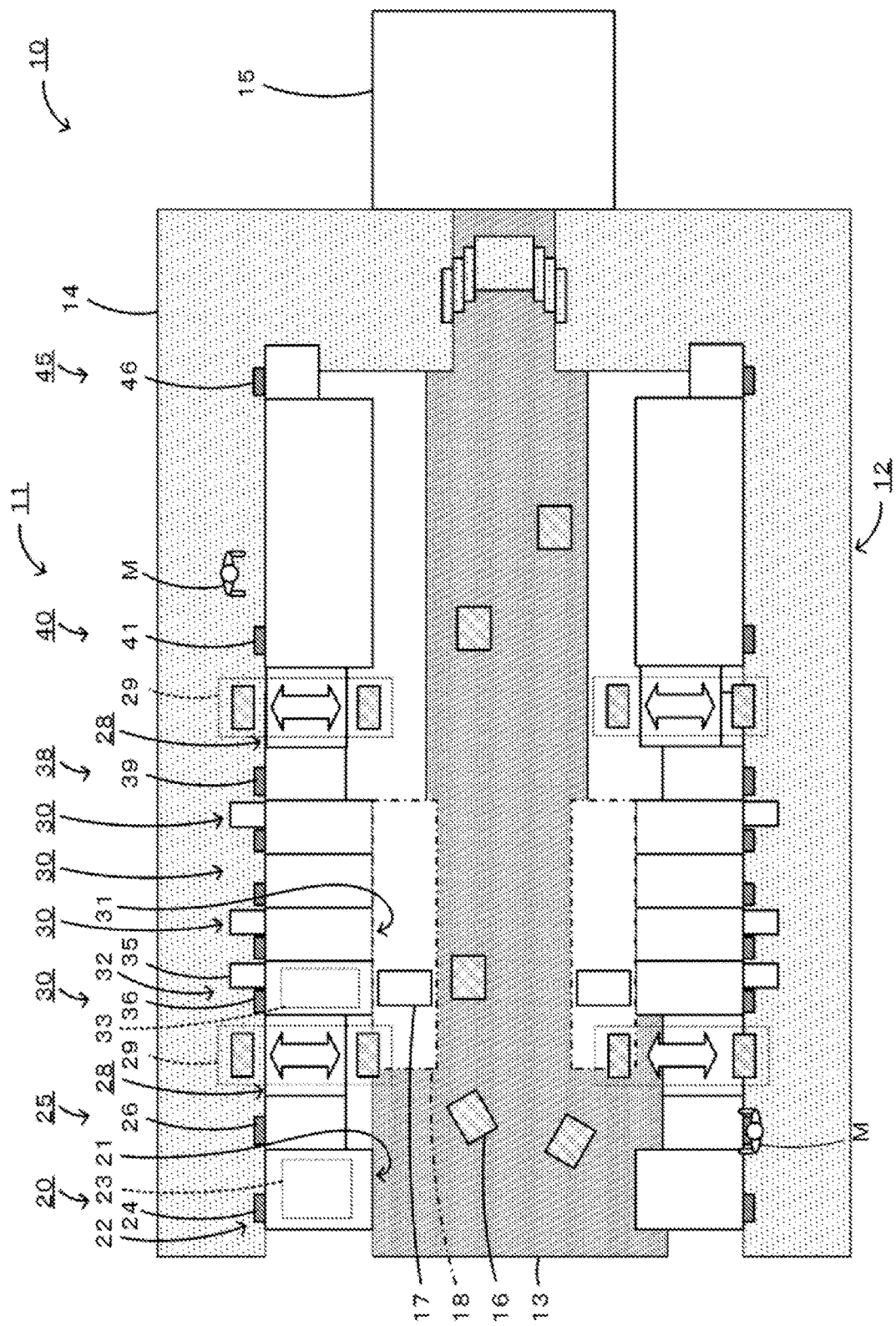
FIG. 1 is a schematic view illustrating an example of mounting system 10.
Figure 2:
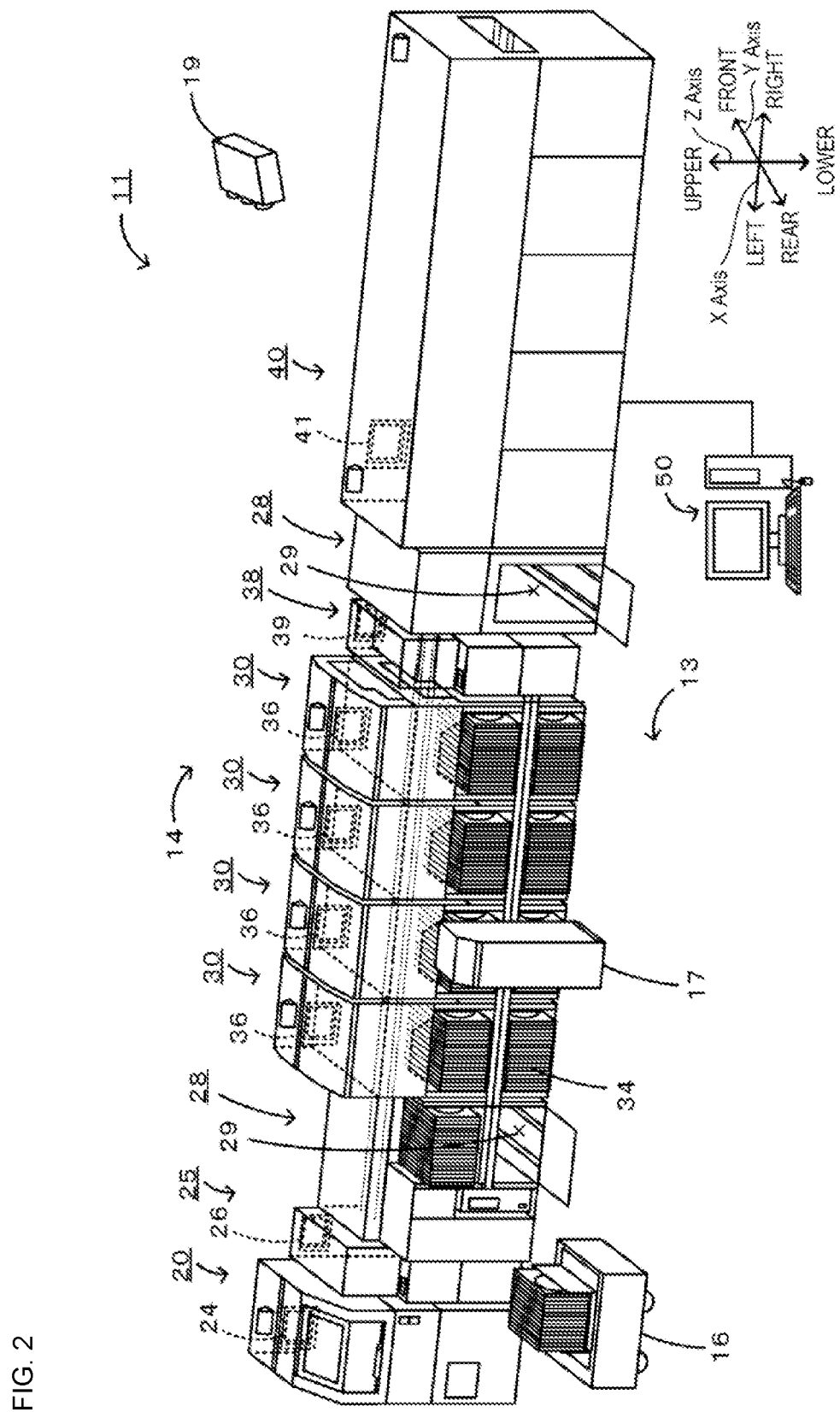
FIG. 2 is a view illustrating an outline of a configuration of first mounting line 11.
Figure 3:
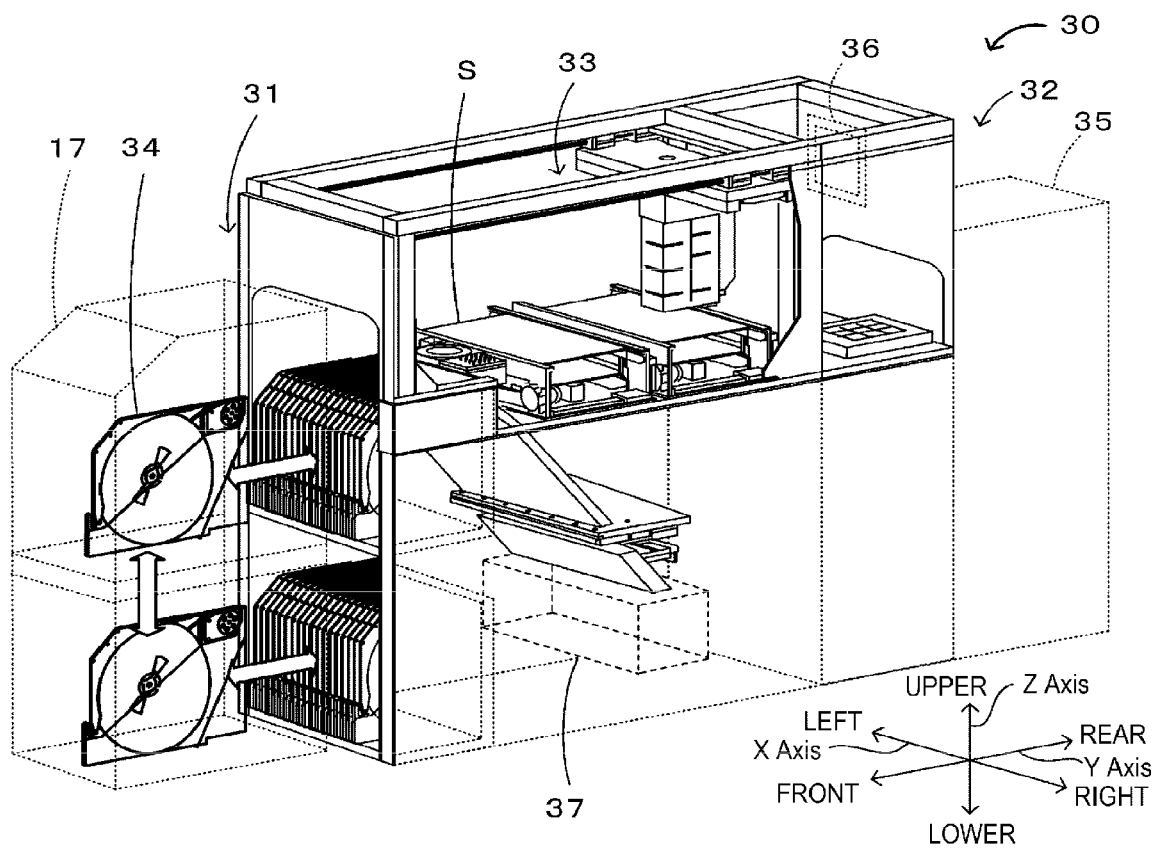
FIG. 3 is a view illustrating an outline of a configuration of mounting device 30.

The present embodiment will be described below with reference to the accompanying drawings. FIG. 1 is a schematic view illustrating an example of mounting system 10 according to the present disclosure. FIG. 2 is a view illustrating an outline of a configuration of first mounting line 11. FIG. 3 is a view illustrating an outline of a configuration of mounting device 30. The mounting system 10 is, for example, a system in which components are mounted on substrate S (see FIG. 3) as a mounting target. In the present embodiment, a left-right direction (X-axis), a front-rear direction (Y-axis), and a vertical direction (Z-axis) are as illustrated in FIGS. 2 and 3.

Mounting system 10 includes first mounting line 11, second mounting line 12, storage container 15, projector 19, management PC 50, a mobile work device, and the like. In first mounting line 11 and second mounting line 12, multiple mounting-related devices related to a process of mounting components on substrate S are arranged side by side along the conveyance direction of substrate S. The mounting-related device includes, for example, one or more of printing device 20, printing inspection device 25, conveyance device 28, mounting device 30, mounting inspection device 38, reflow device 40, reflow inspection device 45, and the like. Mounting system 10 includes these devices. The mounting-related device includes an execution unit configured to execute a mounting-related process, and includes a first interface at which the mobile work device that moves a member related to the mounting-related process accesses the execution unit and a second interface which is located on an opposite side to the first interface and configured to allow an operator access while not allowing the mobile work device access. For example, as illustrated in FIG. 1, printing device 20 has first interface 21 and second interface 22. Further, mounting device 30 includes first interface 31 and second interface 32. The second interface is provided with an operation panel including an operation section which operator M operates and to which operator M inputs various commands, and a display section that displays a screen. Mounting system 10 constitutes a mounting line by arranging the multiple first interfaces on a first interface side and the multiple second interfaces on a second interface side. Automatic processing area 13 and operator area 14 separated from each other by the mounting-related device are formed in mounting system 10. Automatic processing area 13 is an area on the first interface side, and is an area in processing is performed automatically by the mobile work device. Operator area 14 is an area on the second interface side, and is an area that the mobile work device does not enter and in which operator M performs work. In the present embodiment, mounting system 10 having two mounting lines including first mounting line 11 and second mounting line 12 and having automatic processing area 13 on the inner side thereof and operator area 14 on the outer side thereof will be described as an example.

Storage container 15 is a storage location for various units used in the mounting-related device. In storage container 15, operator M prepares various units to be used in the mounting-related device. For example, operator M performs a process of extracting a tape from feeder 34 (see FIGS. 2 and 3) after use in storage container 15, a process of mounting the tape to new feeder 34, and the like. Various prepared units are placed to be conveyable automatically by the mobile work device.

The mobile work device is automated guided vehicle 16, loader 17 or the like. Automated guided vehicle 16 moves between storage container 15 for storing members related to the mounting-related process and the mounting line. For example, automated guided vehicle 16 automatically conveys feeder 34 between storage container 15 and first mounting line 11 and second mounting line 12. Loader 17 is an automatic collection and replenishment device that moves within moving region 18 between the mounting lines and collects and replenishes a member related to the mounting-related process. Loader 17 automatically collects and replenishes feeder 34 of mounting device 30. Further, loader 17 may collect and replenish waste of the tape holding the component. The mobile work device sequentially outputs information such as a moving distance and a moving speed to management PC 50.

Projector 19, which is a device that projects an image on a floor surface or a wall surface, for example, performs a process of projecting, as an image, a range in which operator M can move or a range in which the mobile work device (automated guided vehicle 16 and loader 17) moves, on a floor surface or a wall surface of automatic processing area 13.

Printing device 20 includes printing unit 23 that executes a printing process of printing solder on substrate S. Printing unit 23 is a unit of applying (printing) solder onto lower substrate S through a pattern hole formed in a screen mask by pressing the solder into the pattern hole using a squeegee. Printing device 20 has operation panel 24 disposed on the second interface side 22. Printing inspection device 25 includes an inspection unit that executes a print inspection process of inspecting a state of the printed solder. The inspection unit is a unit for inspecting a printing state of the solder using an image obtained by imaging substrate S on which the solder is printed. Printing inspection device 25 has operation panel 26 disposed on the second interface side.

Conveyance device 28 includes a conveyance unit that conveys substrate S. Conveyance unit is a unit that conveys substrate S by a pair of conveyor belts bridged over at intervals. Further, as illustrated in FIG. 2, conveyance device 28 may have a function of a feeder storage container for stocking feeder 34 conveyed by automated guided vehicle 16 from storage container 15. Loader 17 is set to acquire new feeder 34 from this feeder storage container and replace new feeder 34 with used feeder 34. Further, member access section 29 that can be used to move a member between automatic processing area 13 and operator area 14 is provided at a lower portion of conveyance device 28. Member access section 29 may be, for example, a shuttle section for loading and moving the member. Examples of a moving member include a feeder, a feeder magazine having multiple feeders, a waste box accommodating a waste tape conveyed by automated guided vehicle 16, and the like.

As illustrated in FIG. 3, mounting device 30 includes first interface 31, second interface 32, mounting unit 33, operation panel 36, and waste box 37. Mounting unit 33, which is a unit that collects the component and mounts the component on substrate S by a mounting head having a collection member such as a nozzle installed thereon, includes feeder 34 and tray unit 35. Feeder 34 is configured as a tape feeder that feeds the tape that holds the components at a predetermined pitch. Feeder 34 can be automatically replaced by loader 17 and is disposed on the first interface 31 side. Tray unit 35 accommodates one or more trays in which components are arranged. Replacement of trays is set to be performed by operator M, and tray unit 35 is disposed on the second interface 32 side. Waste box 37 is movably disposed at a lower portion of a housing of mounting device 30, and accommodates, for example, the tape used in feeder 34. Waste box 37 can be moved to the outside of the device by a moving mechanism that is not illustrated, and is automatically moved to member access section 29 by automated guided vehicle 16 or the like. A waste moving mechanism (for example, a waste conveyor) or the like may be provided in mounting device 30 to collect waste in one or multiple waste boxes (for example, a waste box in member access section 29). Mounting inspection device 38 includes an inspection unit for executing a mounting inspection process of inspecting a state of the component in the substrate on which the component is mounted. Mounting inspection device 38 has operation panel 39 disposed on the second interface side.

Reflow device 40 includes a reflow unit for executing a reflow process of substrate S and operation panel 41. The reflow unit is a unit that melts solder by heating substrate S on which the component is disposed on the solder, and then cools the melted solder to electrically connect and fix the component on substrate S. Reflow device 40 has operation panel 41 disposed on the second interface side. Reflow inspection device 45 includes an inspection unit for executing a reflow inspection process of inspecting substrate S after reflow. The inspection unit is a unit for finally inspecting the state of the component on substrate S based on an image obtained by imaging reflowed substrate S. Reflow inspection device 45 has operation panel 46 disposed on the second interface side.

The management PC 50 (see FIG. 2) is configured as a server for managing information of each device of mounting system 10. Management PC 50 includes a control section that controls the entire device, a storage section that stores various pieces of information, and a communication section that performs two-way communication with external devices such as the mounting-related device, automated guided vehicle 16, loader 17, and projector 19. Management PC 50 manages a mounting job used for a process of mounting components P and acquires and manages information on mounting system 10. Management PC 50 also manages a current position of the mobile work device and manages a range of automatic processing area 13 and operator area 14.

Figure 4:
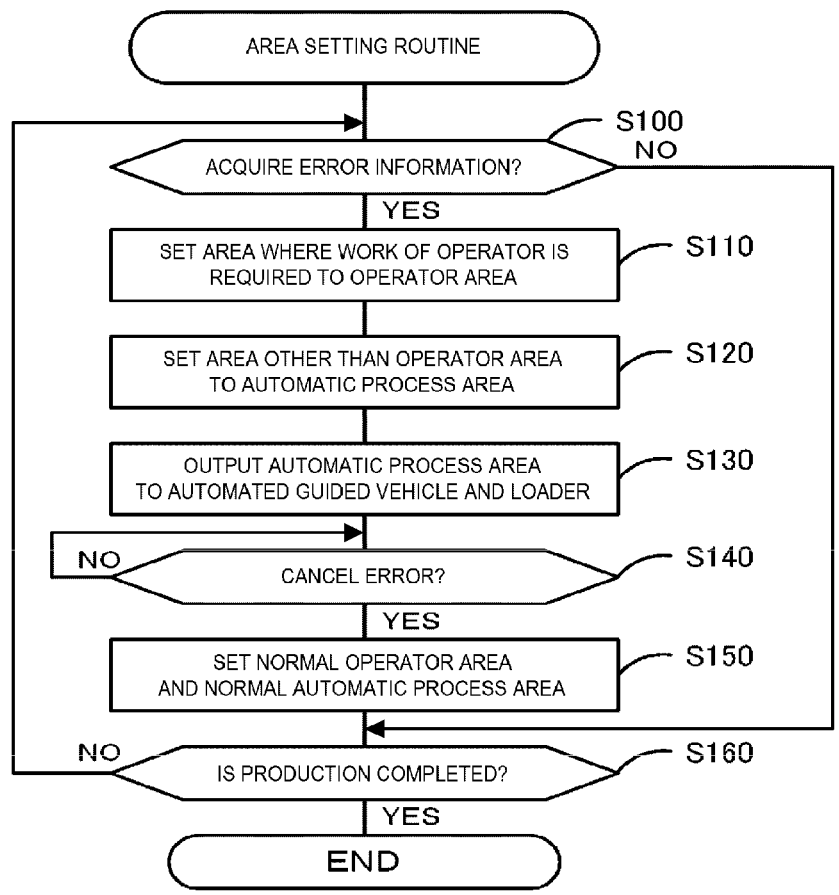
FIG. 4 is a flowchart illustrating an example of an area setting routine.

Next, an operation of mounting system 10 of the present embodiment configured in this manner will be described. FIG. 4 is a flowchart illustrating an example of an area setting routine executed by the CPU of the control section of management PC 50. This routine is stored in the storage section of management PC 50 and is executed by a start instruction by operator M. When this routine is started, first, the CPU of management PC 50 determines whether error information is acquired from the mounting-related device (S100). Each mounting-related device outputs the error information to management PC 50 when an operation failure or the like occurs in the device. When acquiring the error information, the CPU identifies a device in which an error has occurred, and sets, as operator area 14, a moving path of operator M to the device and a region where the work of operator M is required (S110). Further, the CPU sets an area other than operator area 14 as automatic processing area 13 (S120). Then, the CPU outputs information on the set areas to the mobile work device such as automated guided vehicle 16 and loader 17 (S130).

Figure 5:
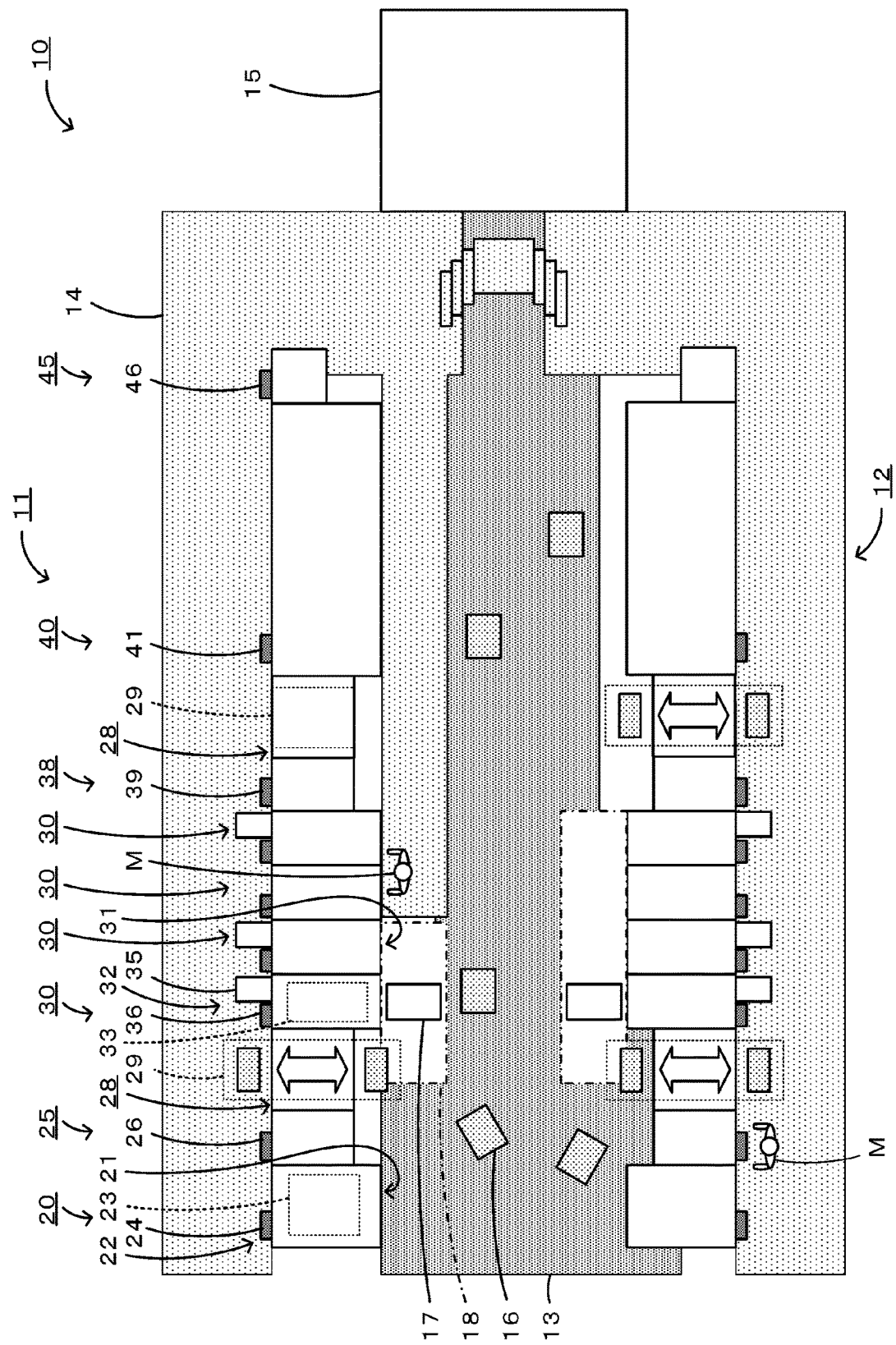
FIG. 5 is a view illustrating an example of a change of automatic processing area 13 and operator area 14.
Figure 6:
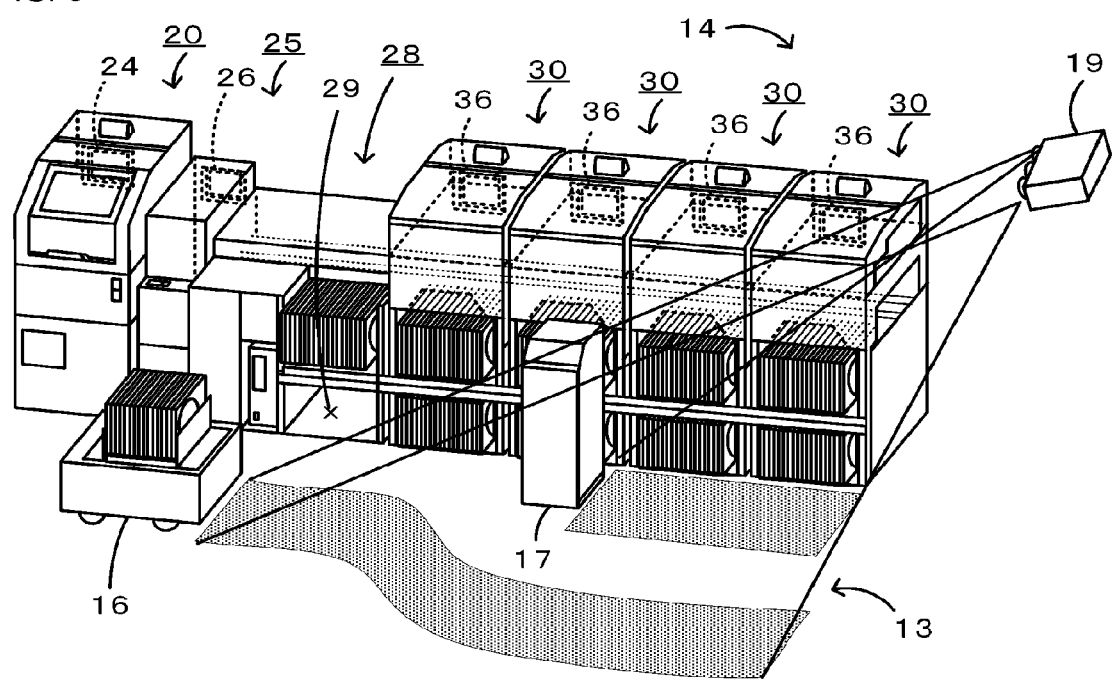
FIG. 6 is a view of an example for displaying a moving region of a mobile work device.

FIG. 5 is a view illustrating an example of a change of automatic processing area 13 and operator area 14. As illustrated in FIG. 5, when work by operator M from the first interface side to the mounting-related device is required, management PC 50 sets, as operator area 14, an area of automatic processing area 13 which operator M enters, and sets the other area as automatic processing area 13. Management PC 50 transmits the set area to automated guided vehicle 16 and loader 17. Automated guided vehicle 16 and loader 17 move within a range of newly set automatic processing area 13. Further, management PC 50 may display a moving region of the mobile work device on the floor surface or the wall surface of automatic processing area 13. FIG. 6 is a view of an example of displaying a moving region of the mobile work device. Management PC 50 may cause projector 19 to project a moving range or the like of automated guided vehicle 16 or loader 17 onto automatic processing area 13. In this way, operator M can visually recognize the moving range of the mobile work device, so that it is possible to further suppress the automatic process of the mobile work device from being hindered.

Further, the CPU determines whether the error has been canceled based on a signal acquired from a target device (S140). The CPU waits until the error is canceled, and when the error is canceled, sets normal automatic processing area 13 and normal operator area 14 before the change (S150). After S150 or when the error information is not acquired by S100, the CPU determines whether the production of mounting system 10 is completed (S160), and if the production is not completed, repeatedly executes the processes after S100. On the other hand, when the production is completed, the routine is terminated as is. In this manner, when operator M needs to perform work in an automatic processing area of the mobile work device, the mobile work device is prevented from entering the work area of operator M.

Here, a correspondence relationship between components of the present embodiment and components of the present disclosure will be clarified. Printing device 20, printing inspection device 25, conveyance device 28, mounting device 30, mounting inspection device 38, reflow device 40, and reflow inspection device 45 of the present embodiment correspond to the mounting-related device of the present disclosure, and printing unit 23, the inspection unit, the conveyance unit, mounting unit 33, and the reflow unit correspond to the execution unit. Further, first interface 21 and first interface 31 correspond to the first interface, second interface 22 and second interface 32 correspond to the second interface, and operation panels 24, 26, 36, 39, 41, 46 correspond to the operation panel. Further, automatic processing area 13 corresponds to the automatic processing area, operator area 14 corresponds to the operator area, automated guided vehicle 16 and loader 17 correspond to the mobile work device, and management PC 50 corresponds to the management device.

In above-described mounting system 10, the multiple mounting-related devices that execute a mounting-related process related to a process of mounting a component on substrate S (mounting target) are arranged side by side along the conveyance direction of substrate S. The mounting-related device has an execution unit configured to execute the mounting-related process, a first interface configured to access the execution unit by the mobile work device configured to move a member related to the mounting-related process, and a second interface, being located on an opposite side of the first interface and configured to allow an operator M access while not allowing the mobile work device access. Further, an operation panel is disposed on the second interface. In this mounting-related device, when multiple mounting lines are arranged and formed along the conveyance direction of substrate S, automatic processing area 13 in which the mobile work device moves and works is formed at the first interface, and operator area 14 in which an operator works is formed at the second interface. That is, in this mounting-related device, automatic processing area 13 and operator area 14 separated from each other by the mounting-related device are formed, and a time during which operator M enters automatic processing area 13 can be greatly shortened. Therefore, in this mounting-related device, it is possible to suppress a decrease in an operation rate of the mobile work device.

Further, in mounting system 10, multiple mounting lines are configured by arranging the first interface of the mounting-related device on a first side and the second interface of the mounting-related device on a second side, the first interface side being at automatic processing area 13 in which automatic processing is performed by the mobile work device, and the second interface side being at operator area 14 in which work is performed by operator M and in which the mobile work device does not enter. In mounting system 10, since automatic processing area 13 and operator area 14 separated from each other by the mounting line by the mounting-related device are formed, a time during which the operator enters automatic processing area 13 can be greatly shortened. Therefore, in this mounting system 10, it is possible to suppress a decrease in the operation rate of the mobile work device. Further, first mounting line 11 and second mounting line 12 have member access sections 29 that can be used to move a member between automatic processing area 13 and operator area 14. In this mounting system 10, it is easy to replace a member related to the mounting-related process via member access section 29.

Further, when work by operator M to the mounting-related device is required from the first interface side, management PC 50 as a management device sets automatic processing area 13 as an area other than the area which operator M enters among automatic processing area 13. In this mounting system 10, even when operator M enters automatic processing area 13, it is possible to secure the work of the mobile work device, and it is possible to further suppress a decrease in the operation rate of the mobile work device. Further, since the mobile work device is loader 17 as automated guided vehicle 16 or an automatic collection and replenishment device, it is possible to further suppress a decrease in the operation rate of automated guided vehicle 16 or the automatic collection and replenishment device in this mounting system. Further, since the mounting line includes maintenance or the like that occurs during a mounting process of the mounting-related device, it is not easy to achieve complete automation that eliminates operator M, making the mounting-related device and the mounting line of the present disclosure particularly suitable.

It is obvious that the present disclosure is not limited to the above-described embodiments and can be implemented in various modes as long as the modes belong to the technical scope of the present disclosure.

Figure 7:
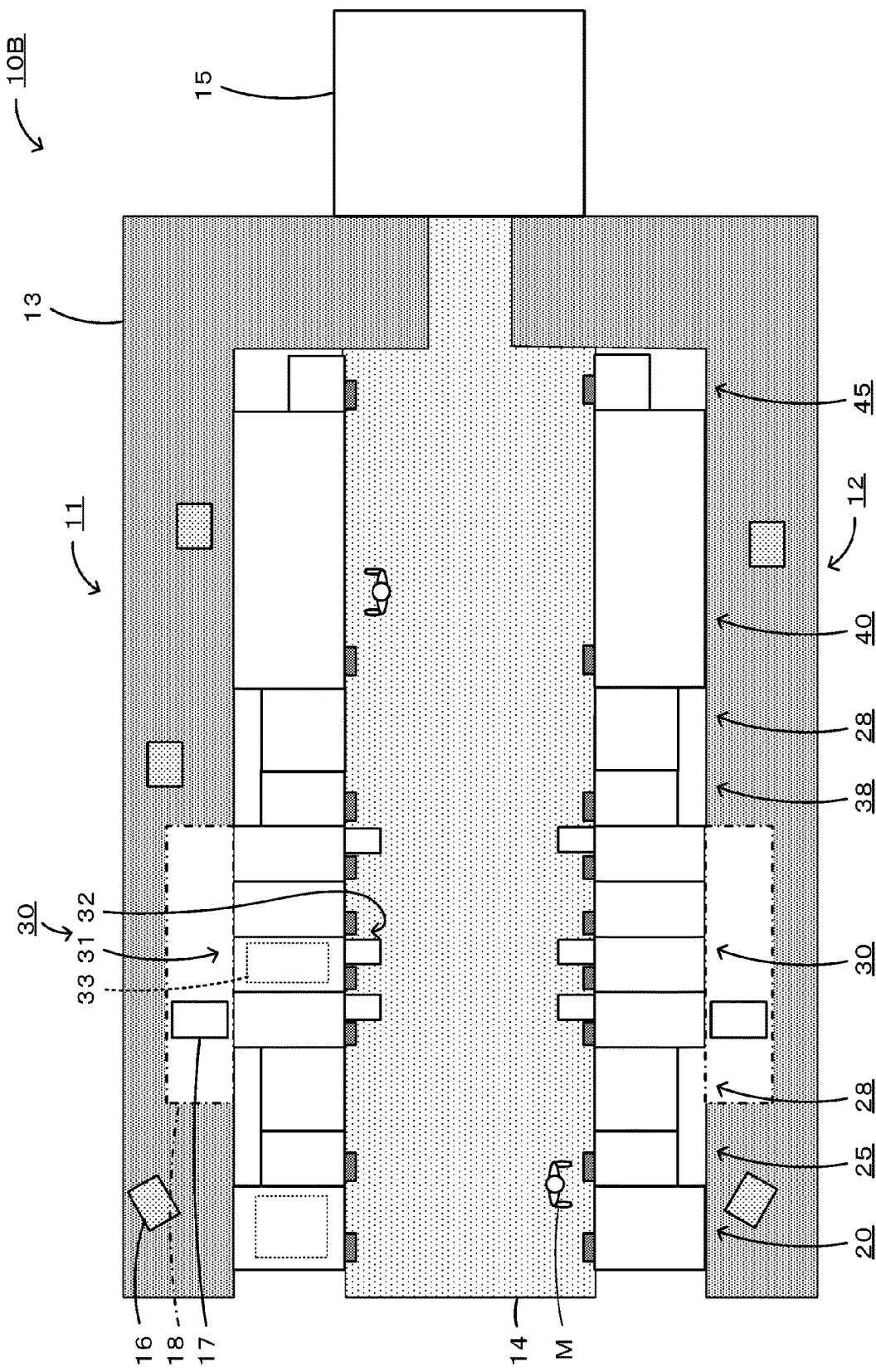
FIG. 7 is a schematic view illustrating an example of another mounting system 10B.

For example, in the above-described embodiment, automatic processing area 13 is defined between the mounting lines, and operator area 14 is defined outside the mounting lines, but the present disclosure is not particularly limited thereto. For example, as illustrated in FIG. 7, mounting system 10B may be configured such that operator area 14 is located between the mounting lines and automatic processing area 13 is located outside the mounting lines. Even in this mounting system 10B, since automatic processing area 13 and operator area 14 separated from each other by the mounting lines are formed, it is possible to suppress a decrease in the operation rate of the mobile work device.

In the above-described embodiment, mounting system 10 includes printing device 20, printing inspection device 25, conveyance device 28, mounting device 30, mounting inspection device 38, reflow device 40, and reflow inspection device 45. However, the present disclosure is not particularly limited thereto, and one or more of the devices may be omitted or a device other than the above devices may be added. So long as automatic processing area 13 and operator area 14 separated from each other by the mounting lines are formed, similar to the above-described embodiment, it is possible to suppress a decrease in the operation rate of the mobile work device.

In the above-described embodiment, the mounting line has member access section 29 where a member is moved between automatic processing area 13 and operator area 14, but may alternatively or additionally have one or more operator access sections that allow the operator to enter a space between automatic processing area 13 and operator area 14. The operator access section may be a conveyor gate that allows the operator to move by lifting up a conveyor. When mounting system 10 has such an operator access section, the operator easily enters automatic processing area 13 if necessary. In the operator access section, for example, management PC 50 may lock or unlock the conveyor gate based on a state of the mobile work device, thereby prohibiting or permitting entry of the operator into automatic processing area 13. Alternatively, when management PC 50 detects the entry of the operator into automatic processing area 13 by the operator access section, the management PC 50 may change an operation mode of the mobile work device from a normal automatic process mode to an operator entry mode having higher safety. The operator entry mode may be, for example, a mode in which an operation is slower than a normal mode or a mode in which the presence of the operator is detected in a larger range than the normal mode and the operation of the mobile work device is stopped. Further, in mounting system 10, member access section 29 may be omitted. Even in this mounting system 10, it is possible to suppress a decrease in the operation rate of the mobile work device.

In the above-described embodiment, mounting system 10 includes projector 19, but projector 19 may be omitted. Further, in mounting system 10, tray unit 35 is disposed on operator area 14 side, but tray unit 35 may be disposed on the automatic processing area 13 side as loader 17 automatically replaces tray unit 35. Further, although the mobile work device is automated guided vehicle 16 or loader 17, the mobile work device may be any one thereof or may include an automatic work device other than automated guided vehicle 16 or loader 17.

In the above-described embodiment, it has been described that management PC 50 changes automatic processing area 13 and operator area 14. However, the change may be omitted. In mounting system 10, when automatic processing area 13 and operator area 14 separated from each other by the mounting line are formed, similar to the above-described embodiment, it is possible to suppress a decrease in the operation rate of the mobile work device.

In the above-described embodiment, it has been described that the present disclosure is applied to a form of mounting system 10. However, the present disclosure may be applied to the mounting-related device.

Here, the mounting system including the mounting-related device of the present disclosure may be configured as follows. For example, in the mounting-related device of the present disclosure, the execution unit may be one or more of a printing unit, a mounting unit, an inspection unit, a conveyance unit, and a reflow unit. That is, the mounting-related device may be one or more of a printing device, a mounting device, an inspection device, a conveyance device, and a reflow device.

In the mounting system of the present disclosure, the mounting system may be comprised of the above-described mounting-related devices multiply arranged such that the first interfaces are on a first side and the second interfaces are on a second side, thereby constituting the mounting line, wherein the first interface side may be an automatic processing area in which processing is performed automatically by the mobile work device, and the second interface side may be an operator area in which the operator performs work and in which the mobile work device does not enter. In this mounting system, similar to the above-described mounting-related device, the automatic processing area and the operator area separated from each other by the mounting-related device are formed, and the time during which the operator enters the automatic processing area can be greatly shortened. Therefore, in this mounting system, it is possible to suppress a decrease in the operation rate of the mobile work device.

In the mounting system of the present disclosure, the mounting line may include one or more access sections that can be used to move a member between the automatic processing area and the operator area. In this mounting system, it is possible to replace the member related to the mounting-related process via the access sections. Further, in the mounting system of the present disclosure, the mounting line may have one or more operator access sections that allow the operator to enter a space between the automatic processing area and the operator area. In this mounting system, the operator can move to the automatic processing area as needed. The mounting system may include a management device configured to exchange information with the mounting-related device and manage the information on the mounting-related device, and the management device may regulate entry of the operator into the automatic processing area by the operator access section. In this mounting system, it is possible to suppress a decrease in the operation rate of the mobile work device by regulating the entry of the operator into the automatic processing area. Further, the management device may change the operation mode of the mobile work device to a safer mode when detecting the entry of the operator from the operator access section into the automatic processing area. In this mounting system, the operator can more safely perform work in the automatic processing area.

The mounting system of the present disclosure may include a management device configured to exchange information with the mounting-related device and manage information on the mounting-related device, and in the automatic processing area, the management device sets an area other than the area where the operator enters, to the automatic processing area, when an operation on the mounting-related device by the operator is required from the first interface side. In this mounting system, even when the operator enters the automatic processing area, it is possible to secure the work of the mobile work device, and it is possible to suppress a decrease in the operation rate of the mobile work device.

In the mounting system of the present disclosure, the mobile work device may be one or more of an automated guided vehicle which moves between a storage container, for storing a member related to the mounting-related process, and the mounting line, and an automatic collection and replenishment device, moving between the mounting lines, which collects or replenishes the member related to the mounting-related process. In this mounting system, it is possible to suppress a decrease in the operation rate of the automated guided vehicle and the automatic collection and replenishment device.

INDUSTRIAL APPLICABILITY

The present disclosure is applicable to the technical field of a device configured to collect and mount a component.

REFERENCE SIGNS LIST 10, 10B: mounting system; 11: first mounting line; 12: second mounting line; 13: automatic processing area; 14: operator area; 15: storage container; 16: automated guided vehicle; 17: loader; 18: moving region; 19: projector; 20: printing device; 21: first interface; 22: second interface; 23: printing unit; 24: operation panel; 25: printing inspection device; 26: operation panel; 28: conveyance device; 29: access section; 30: mounting device; 31: first interface; 32: second interface; 33: mounting unit; 34: feeder; 35: tray unit; 36: operation panel; 37: waste box; 38: mounting inspection device; 39: operation panel; 40: reflow device; 41: operation panel; 45: reflow inspection device; 46: operation panel; 50: management PC; M: operator; S: substrate

The invention claimed is:

1. A mounting-related device used in a mounting system, in which multiple mounting-related devices, each being configured to execute a mounting-related process related to a process of mounting a component to a mounting target, are arranged side by side along a conveyance direction of the mounting target, the mounting-related device comprising:
an execution unit housed in the mounting-related device configured to execute the mounting-related process to the mounting target;
a first interface on a first external surface of the mounting-related device in a direction perpendicular to the conveyance direction, the first interface configured to enable a mobile work device to supply a member related to the mounting-related process to the mounting-related device, the mobile work device moving in an automatic processing area outside of the first external surface of the mounting-related device; and
an operation panel disposed in a second interface, the second interface located on a second external surface of the mounting-related device on an opposite side of the mounting-related device with regards to the first interface and configured to allow an operator access to the operation panel without allowing access by the mobile work device.

2. The mounting-related device according to claim 1, wherein the execution unit is at least one of a printing unit, a mounting unit, an inspection unit, a conveyance unit, and a reflow unit, and
wherein the execution unit is housed between the first external surface and the second external surface.

3. A mounting system comprising multiple mounting-related devices according to claim 1,
wherein multiple of the first interfaces are arranged on a first side, and multiple of the second interfaces are arranged on a second side thereby constituting a mounting line, and
wherein the first side is adjacent to the automatic processing area for automatic processing by the mobile work device, and the second side is adjacent an operator area in which an operator performs work without the mobile work device entering the operator area.

4. The mounting system according to claim 3, wherein the mounting line has one or more member access sections where a member is moved between the automatic processing area and the operator area.

5. The mounting system according to claim 3,
wherein the mounting system further comprises a management processor configured to exchange information with the multiple mounting-related devices and manage information on the multiple mounting-related devices,
wherein the mounting line has one or more operator access sections that allow the operator to enter between the automatic processing area and the operator area, and
wherein the management processor executes one or more modes from a regulation mode which causes the operator access section to regulate entry of the operator into the automatic processing area, and a mode-changing mode which changes an operation mode of the mobile work device to a safe mode upon a detection of entry of the operator from the operator access section into the automatic processing area.

6. The mounting system according to claim 3,
wherein the mounting system further comprises a management processor configured to exchange information with the multiple mounting-related devices and manage information on the multiple mounting-related devices,
wherein in the automatic processing area, the management processor sets an area other than an area where the operator enters as the automatic processing area, when an operation by the operator on the mounting-related device is required from the first side.

7. The mounting system according to claim 3, wherein the mobile work device is an automated guided vehicle that moves between a storage container external to the mounting line, for storing the member related to the mounting-related process, and the mounting line.

8. The mounting system according to claim 3, wherein the mobile work device is an automatic collection and replenishment device that moves along the first external surface the multiple mounting-related devices to collect or replenish the member related to the mounting-related process.

* * * * *